(12) United States Patent
Noehte et al.

(10) Patent No.: US 7,445,873 B2
(45) Date of Patent: *Nov. 4, 2008

(54) LITHOGRAPH WITH BEAM GUIDANCE AND METHOD OF PRODUCING DIGITAL HOLOGRAMS IN A STORAGE MEDIUM

(75) Inventors: Steffen Noehte, Weinheim (DE); Christoph Dietrich, Heidelberg (DE); Robert Thomann, Heidelberg (DE); Stefan Stadler, Hamburg (DE); Jörn Leiber, Hamburg (DE)

(73) Assignee: Tesa Scribos GmbH, Heidelberg (DE)

( * ) Notice: Subject to any disclaimer, the term of this patent is extended or adjusted under 35 U.S.C. 154(b) by 590 days.

This patent is subject to a terminal disclaimer.

(21) Appl. No.: 10/473,546

(22) PCT Filed: Mar. 28, 2002

(86) PCT No.: PCT/EP02/03499

§ 371 (c)(1),
(2), (4) Date: Feb. 25, 2004

(87) PCT Pub. No.: WO02/079883

PCT Pub. Date: Oct. 10, 2002

(65) Prior Publication Data

US 2004/0136040 A1  Jul. 15, 2004

(30) Foreign Application Priority Data

Mar. 30, 2001  (DE) .................. 101 16 058

(51) Int. Cl.
G03H 1/08 (2006.01)
G03F 7/20 (2006.01)
A61N 5/00 (2006.01)

(52) U.S. Cl. .................. 430/1; 430/2; 359/9; 359/35
(58) Field of Classification Search .................. None
See application file for complete search history.

(56) References Cited

U.S. PATENT DOCUMENTS 3,925,785 A  12/1975  Firtion (Continued)

FOREIGN PATENT DOCUMENTS

DE  693 22 115  9/1993

(Continued)

OTHER PUBLICATIONS

Langlois et al., 'Diffractive optical elements fabricated by direct laser writing and other techniques' Proc. SPIE vol. 1751., pp. 2-12 (1992).*

*Primary Examiner*—Martin J Angebranndt
(74) *Attorney, Agent, or Firm*—Proskauer Rose LLP

(57) ABSTRACT

Producing a digital hologram in a storage medium includes: (i) focusing a write beam onto the storage medium; (ii) moving the write beam two-dimensionally relative to the storage medium; (iii) focusing a scanning beam onto a beam-guiding mask having a plurality of tracks; (iv) moving the scanning beam two-dimensionally relative to the mask, the movement of the scanning beam being coupled with the movement of the write beam; (v) generating a position control signal when the position of the scanning beam deviates from the scanned track by a predefined value; (vi) controlling the position of the write beam on the storage medium with the aid of the position control signal; and (vii) writing the hologram by introducing radiation energy point by point, the intensity of the write beam being controlled as a function of the position of the write beam on the storage medium.

40 Claims, 3 Drawing Sheets

U.S. PATENT DOCUMENTS

| | | | |
|---|---|---|---|
| 4,312,590 A * | 1/1982 | Harbaugh | 355/51 |
| 4,393,411 A * | 7/1983 | Amtower | 358/302 |
| 4,646,144 A * | 2/1987 | Ishida et al. | 358/517 |
| 4,688,932 A | 8/1987 | Suzuki | |
| 5,289,407 A * | 2/1994 | Strickler et al. | 365/106 |
| 5,617,500 A * | 4/1997 | Shionoya et al. | 385/132 |
| 6,768,562 B1 * | 7/2004 | Takada et al. | 358/296 |
| 2003/0022105 A1 * | 1/2003 | Prasad et al. | 430/270.15 |
| 2004/0173761 A1 * | 9/2004 | Noehte et al. | 250/492.1 |
| 2004/0233490 A1 * | 11/2004 | Noehte et al. | 359/35 |
| 2005/0248821 A1 * | 11/2005 | Noehte et al. | 359/30 |

FOREIGN PATENT DOCUMENTS

| | | |
|---|---|---|
| DE | 199 39 617 A | 3/2001 |
| EP | 0 561 302 | 9/1993 |
| EP | 0 950 924 | 10/1999 |

* cited by examiner

LITHOGRAPH WITH BEAM GUIDANCE AND METHOD OF PRODUCING DIGITAL HOLOGRAMS IN A STORAGE MEDIUM

BACKGROUND OF THE INVENTION

The present invention relates to a lithograph for producing digital holograms in a storage medium. In particular, the lithograph has a light source for producing a write beam, drive means for the two-dimensional movement of the write beam relative to the storage medium and a first objective for focusing the write beam onto the storage medium to be written. Furthermore, the invention relates to a method of producing digital holograms in a storage medium.

Digital holograms are two-dimensional holograms which consist of individual points with different optical properties and from which, when illuminated with a coherent electromagnetic wave, in particular a light wave, images and/or data are reproduced by means of diffraction in transmission or reflection. The different optical properties of the individual points can be reflective properties, for example as a result of surface topography, varying optical path lengths in the material of the storage medium (refractive indices) or color values of the material.

The optical properties of the individual points are calculated by a computer, and this thus involves what are known as computer-generated holograms (CGH). With the aid of the focused write beam, during the writing of the hologram the individual points of the hologram are written into the material, the focus being located in the region of the surface or in the material of the storage medium.

In the region of the focus, focusing has the effect of a small area of action on the material of the storage medium, so that a large number of points of the hologram can be written in a small area. The optical property of the respectively written point in this case depends on the intensity of the write beam. For this purpose, the write beam is scanned in two dimensions over the surface of the storage medium with varying intensity. The modulation of the intensity of the write beam is in this case carried out either via internal modulation of the light source, for example a laser diode, or via external modulation of a write beam outside the light source, for example with the aid of optoelectronic elements. Furthermore, the light source can be formed as a pulsed laser whose pulse lengths can be controlled, so that control of the intensity of the write beam can be carried out via the pulse lengths.

As a result of the scanning of the intensity-modulated write beam, an area with an irregular point distribution is thus produced, the digital hologram. This can be used to identify and individualize any desired objects.

Scanning lithographic systems are intrinsically widespread. For example, scanning optical systems are incorporated in conventional laser printers. However, these systems cannot be used for the production of holograms, since the requirements for this intended application differ considerably from those in laser printers. In the case of good printing systems, the resolution is around 2500 dpi while, in the production of holograms, a resolution of about 25,000 dpi is required. In addition, in digital holography, only comparatively small areas are written. These are, for example, 1 to 5 mm$^2$, other sizes also being possible. The accuracy of the write pattern in the case of a lithograph for the production of digital holograms of, for example, 1000×1000points on an area of 1×1 mm$^2$ must be about ±0.1 µm in both orthogonal directions. Furthermore, the writing speed should be about 1 Mpixel/s, in order that in each case a hologram can be written in a time of about 1 s.

Digital holograms can be produced by means of conventional scanning methods, in which the angle of the incident beam is varied by stationary optics. For example, scanning mirror lithographs with galvanometer and/or polygonal scanners operate on this principle.

In all the scanning methods known hitherto, one disadvantage is that no control of the accurate positioning of the write beam is possible which is capable of maintaining a predefined point pattern of the digital hologram at the writing speeds to be achieved.

SUMMARY OF THE INVENTION

The present invention is therefore based on the technical problem of writing computer-generated holograms by means of optical lithography as quickly as possible and with little effort with simultaneous accurate control of the positioning of the write beam.

According to a first teaching of the invention, the technical problem indicated previously is solved by a method of producing digital holograms in a storage medium, in which a write beam is focused onto the storage medium and moved two-dimensionally relative to the storage medium, in which a scanning beam is focused onto a beam-guiding mask having a plurality of tracks and moved two-dimensionally relative to the beam-guiding mask, the movement of the scanning beam being coupled with the movement of the write beam, in which, during the movement along the track to be scanned on the beam-guiding mask, a position control signal is generated when the position of the scanning beam deviates from the scanned track by a predefined value, in which the position of the write beam on the storage medium is controlled with the aid of the position control signal, and in which the hologram is written by introducing radiation energy point by point, the intensity of the write beam being controlled as a function of the position of the write beam on the storage medium.

According to the invention, it has thus been recognized that, with the aid of a scanning beam coupled in its movement to the write beam, a position control signal can be generated with which the physical position of the scanning beam and thus the write beam along predefined tracks can be controlled. In this case, the tracks are preferably arranged in parallel, that is to say in an orthogonal pattern, but this is not absolutely necessary. With the aid of an additional item of timed trigger information and intensity information which, in principle, can be produced independently of the beam-guiding mask, the digital hologram can be written point by point.

The scanning movement of the write beam and of the scanning beam run at a speed which is lower than the speed of the scanning movement of the control movement for tracking the beams. It is also possible to speak of slow scanning and fast tracking.

As explained previously, the position control signal is generated when the scanning beam deviates from the track to be scanned by a predefined value. This value is set within the measurement accuracy such that the control can be carried out at the required speed. In this case, the value can also be equal to zero, so that any deviation leads to a position control signal.

The scanning beam is preferably moved in a predefined movement relationship with the write beam. Thus, the scanning beam can scan a beam-guiding mask whose area is greater than the region of the storage medium to be written. If the beam-guiding mask is, for example, 10 times larger than the hologram to be produced, then the movement of the scanning beam is enlarged in the ratio 10:1 in proportion to the movement of the write beam. If, therefore, for example a hologram with an area of 1×1 mm$^2$ is to be written, the scanning beam scans a beam-guiding mask with an area of 10×10 mm². The aforementioned magnitudes are exemplary and do not constitute any restriction of the invention.

It is further preferred if the scanning beam is focused onto a size which corresponds at most to the track dimension of the beam-guiding mask. This ensures that only the track of interest is scanned and a sufficiently accurate position control signal can be generated.

The optical properties of the tracks can be formed in different ways, in each case use being made of techniques which are known per se from the prior art, in particular from optical storage media such as compact discs (CD) or digital versatile discs (DVD).

In a first embodiment, the tracks of the beam-guiding mask have a different reflectance from the surrounding surface laterally beside the tracks, so that the beam reflected from the surface of the beam-guiding mask can be detected by a detector having at least two sensor surfaces. The position control signal is then derived from the intensity distribution of the reflected scanning beam focused on the detector surface. In this case, the detector, as is also the case in all further embodiments, has at least two detector surfaces, from which the direction of the deviation of the scanning beam laterally in relation to the scanning movement along the track can be derived. Likewise, use can be made of more than two detector surfaces, with which the deviation can be derived even more accurately and, in addition, further imaging properties, such as focusing errors, tracking errors, trigger or direction of movement, can be derived.

In a second embodiment, the tracks of the beam-guiding mask have a different transmission property from the surrounding surface laterally beside the tracks, so that the beam transmitted through the beam-guiding mask can be detected by a detector having at least two sensor surfaces. The position control signal is then derived from the intensity distribution of the transmitted beam measured in this way.

Sections with reflective and with transmissive properties can also be combined with one another in one track. In this case, for example, the reflected beam component can be used to generate the position control signal, while the transmitted beam component is used to generate a trigger signal.

In a third embodiment, the tracks on the beam-guiding mask have a surface structure, for example in the form of grooves, so that the diffracted beam being reflected at the surface of the beam-guiding mask can be detected. The position control signal is then derived from the intensity distribution of the reflected beam, which results substantially from the superimposition of the zeroth and the two first orders of diffraction. The position control signal generated is then also designated a push-pull signal.

In addition, it is preferred for the scanning beam to have three part beams running beside one another, so that, in addition to the intensity of the central beam, the position control signal can be derived from the intensities of the two marginal beams. In this case, if exactly half the two marginal beams run respectively on the opposite edges of a track, for example, their reflected intensity can be evaluated separately and a very accurate position control signal can be generated in the detected scanning beam, for example by means of separate registration of the marginal beams. In order to produce the three beams running in parallel of the three-beam tracking system, a diffraction grating for producing virtual light-source points offset slightly is integrated in a conventional way in the light source for the scanning beam.

All the embodiments of the invention mentioned previously by way of example are based on the fact that the scanning beam is affected by the optical properties of the beam-guiding mask in such a way that a deviation which may occur from a predefined track can be detected and can be converted into a control signal for the positioning of the scanning beam and of the write beam.

A further improvement consists in that, during the scanning of the tracks, an item of direction information is produced, in order to be able to detect inadvertent reverse scanning of the scanning beam on the surface of the beam-guiding mask. As a result, the writing of the hologram can be carried out reliably even under conditions which are not free of vibration. The direction information is produced in particular by two periodic structures with different optical properties, offset by 90° in each case, being formed along the tracks, so that a direction signal can be derived from the signal components produced in the detected beam by the periodic structures.

In a further preferred manner, at least at one of the ends of each track, a marking is provided which contains address information from which the position of the track within the plurality of tracks is derived. Thus, even during the scanning operation, monitoring of the position of the track to be scanned next is also carried out, which improves the accuracy of the production of the hologram.

As has already been mentioned previously, a timed trigger signal and an intensity signal are required to write the digital hologram. The latter can also be produced with the aid of the beam-guiding mask.

For this purpose, the tracks advantageously have a periodic sequence of sections with different optical properties, from which a trigger signal for controlling the intensity of the write beam is derived. Intensity fluctuations are thus contained in the detected scanning beam, from which time information for triggering the write beam can be derived.

In another embodiment, at least at one of the ends of each track, a marking is provided from which a start signal or a stop signal is derived. Thus, at the start of scanning a track, a time signal can be generated with which external triggering at a predefined frequency is triggered. Therefore, during scanning along one of the tracks, beginning with the start signal, a periodic trigger signal is generated, with which the intensity of the write beam is time-controlled.

Furthermore, provision can advantageously be made for the trigger signal to be linked with an intensity control signal, with which the intensity of the write beam is controlled. This intensity control signal can either be derived from the intensity of the scanning beam or be generated externally. For the latter alternative, the intensity control signal is stored externally in a storage means and the associated intensity value is determined with the aid of the position of the track and the time within the scanning of the track.

During the derivation of the intensity control signal from the intensity of the scanning beam itself, optical information is contained in the track of the beam-guiding mask, which information varies the intensity of the scanning beam during the scanning of the track. This can be implemented by means of reflective properties of various sections of the track of different intensity or by topographical elevations or depressions contained in the surface structure. Thus, for example, a row of elevations are arranged in a track formed as a groove.

The beam-guiding mask used is preferably a spatial light modulator (SLM), with which a time-variably adjustable beam-guiding mask can be implemented.

According to a second teaching of the present invention, the technical problem indicated above is solved by a lithograph having the features of claim 19.

The previously described functioning of the present invention and its preferred configurations can also advantageously be used in a scanning, in particular confocal, microscope. In a microscope of this type, the surface to be examined is scanned or observed with a light beam and the reflected light intensity is measured. During the scanning of the surface, the image is then assembled from the measured intensities of the reflected light. The surface is therefore scanned in a pattern, as has been described previously.

In the present case, for this purpose a beam splitter is arranged in the beam path of the reflected beam, in front of or preferably behind the objective, in order to lead the reflected radiation to an optical sensor. The latter measures the reflected intensity.

With a microscope of this type, the technical problem of observing or scanning a surface as quickly as possible and with little effort is solved. This is in accordance with the technical problem on which the lithograph previously described is based. The advantages previously described for the lithograph are likewise achieved in a microscope of this type.

BRIEF DESCRIPTION OF THE DRAWINGS

In the following text, the invention will be explained in more detail using exemplary embodiments and with reference to the appended drawing, in which.

DETAILED DESCRIPTION OF THE INVENTION

Figure 1:
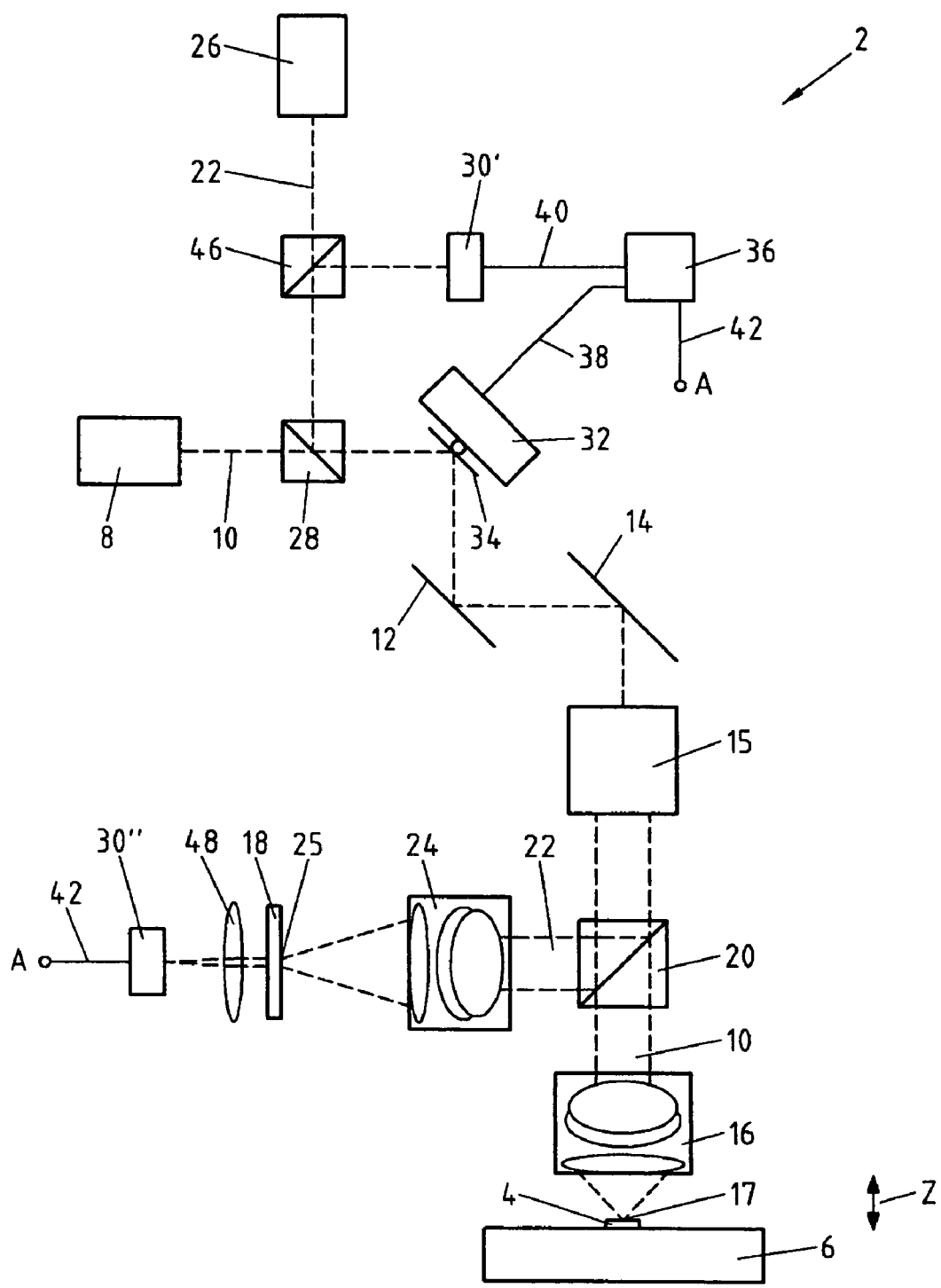
FIG. 1 shows an exemplary embodiment of a lithograph according to the invention.

FIG. 1 shows an exemplary embodiment of a lithograph 2 according to the invention for producing digital holograms in a storage medium 4 which is arranged on a carrier 6. A light source 8 for producing a write beam 10 preferably has a laser or a laser diode, so that the write beam 10 is formed as a laser beam.

The lithograph 2 also has drive means for the two-dimensional movement of the write beam 10 relative to the storage medium 4, which are formed as galvanometrically driven scanning mirrors 12 and 14 and deflect the write beam in two x and y directions arranged substantially orthogonally to each other. The x direction runs, for example, in the plane of FIG. 1 and the y direction runs in a plane at right angles to the plane of the Figure. The mirrors 12 and 14 therefore constitute an x/y scanning mirror arrangement. Instead of one of the two or both galvanometric scanning mirrors, rotatable polygonal mirrors can also be used.

Optionally, a beam spreader or collimator 15 is also arranged in the beam path, behind the scanning mirrors 12 and 14, in order to produce a widened write beam 10.

A first objective 16 focuses the write beam 10 onto the storage medium 4 to be written, so that, at the focus 17, depending on the focused intensity of the write beam 10, the optical property of the storage medium 4 is changed or remains unchanged.

According to the invention, a two-dimensional beam-guiding mask 18 is provided, onto which a scanning beam 22 coupled out of the write beam 10 by a beam splitter 20 is focused at a focus 25 by a second objective 24.

The scanning beam 22 is produced by a second light source 26, and is coupled into the beam path of the write beam 10 in front of the first scanning mirror 12 by a beam splitter 28. The scanning beam 22 has a wavelength or polarization which differs from the write beam 10, so that the beam splitter 28 is formed as a dichroic or polarizing beam splitter. The beam splitter 20 is then correspondingly formed so as to be dichroic or polarizing, in order to couple the scanning beam 22 out of the common beam path.

The scanning beam 22 is therefore independent of the intensity modulation of the write beam 10, so that the latter can also be switched off, that is to say set with an intensity equal to zero.

On the other hand, it is also possible to couple the scanning beam 22 out of the write beam as a part beam without the scanning beam 22 having to be produced by a separate light source. The beam splitters 20 and 28 are then formed as part-transparent beam splitters.

The two objectives 16 and 24 in each case have three lenses of a focusing lens system. However, the precise configuration of the objectives 16 and 24 is unimportant. The objectives 16 and 24 can preferably be formed such that their angular deflections in the x/y direction depend linearly on each other, which produces linear coupling between the movements of the foci 17 and 25.

As emerges from the structure of the lithograph 2 according to FIG. 1, the drive means, that is to say the scanning mirrors 12 and 14, move not only the write beam 10 but also the scanning beam 22. This is because the beam splitter 20 is arranged behind the scanning mirrors 12 and 14 in the beam path of the write beam 10. Thus, the scanning beam 22 is moved two-dimensionally in the same way as the write beam 10, so that the scanning beam 22 is moved relative to the surface of the beam-guiding mask 18. This results in the movement of the scanning beam 22 being coupled with the movement of the write beam 10.

Furthermore, a detector 30' or a detector 30" is provided, alternatively or additionally, to pick up the scanning beam 22 of which the intensity is varied by the optical properties of the respective track of the beam-guiding mask 18. The two different positions are illustrated in FIG. 1. The functioning in the two positions is similar and will be explained in more detail further below.

As FIG. 1 also shows, an actuator 32 with a deflection mirror 34 for tracking the write beam 10 and the scanning beam 22 is arranged in the beam path. The position can in this case be arranged at any desired location in the beam path between the beam splitter 28 and the beam splitter 20.

Furthermore, control means 36 for producing a position control signal are provided, with which the actuator 32 is controlled. For this purpose, a control line 38 is provided. As input signal, the actuator 32 receives from the detector 30', via the line 40, and from the detector 30", via the line 42 (illustrated as interrupted at the points A in FIG. 1), the actual signal with which the control of the beam guidance is carried out.

Furthermore, the control means 36 generate an intensity control signal, which is transmitted to the light source 8 via a line (not illustrated) in order to control the intensity of the write beam 10. The control means 36 are formed as a computer. By means of the transmitted intensity control signal, the write beam 10 is modulated as a function of the position of the focus 25 of the scanning beam 22 on the beam-guiding mask 18, which is coupled with the position of the focus 17 of the write beam 10 on the storage medium 4.

In other words, the write beam 10 is set to write hologram points with two or more different intensity values. In the case of binary writing, the intensity is switched to and for between two different values, depending on whether a point is to be written or not. Likewise, writing hologram points with a gray value graduation is possible and practical.

If, however, as has been described above, the scanning beam 22 is coupled out as a part beam of the write beam 10, without a separate light source being required, then, in order to register the focus 25 on the beam-guiding mask 18, however, it is necessary for the lower or lowest intensity value of the write beam 10 not to be equal to zero. This ensures that the scanning beam 22 always has a minimum intensity for the generation of a position control signal.

Furthermore, in the case of the structure of the lithograph 2 illustrated in FIG. 1, a length-related step-up ratio between the movement of the write beam 10 on the storage medium 4 and of the scanning beam 22 on the trigger matrix 18 is predefined. This is implemented by means of different focal lengths of the two objectives 16 and 26. If, for example, the focal length of the first objective 16 is smaller by a factor 10 than the focal length of the second objective 24, then the movement of the focus 25 of the scanning beam 22 on the trigger matrix 18 is greater by the same factor 10 times than the movement of the focus 17 on the surface of the storage medium 4. In FIG. 1, only a focal length ratio of about 2 is illustrated, for reasons of space. However, this Illustrates that a specific ratio is unimportant in the present configuration of the invention.

Figure 2:
FIG. 2 shows a first exemplary embodiment of a beam-guiding mask.
Figure 3:
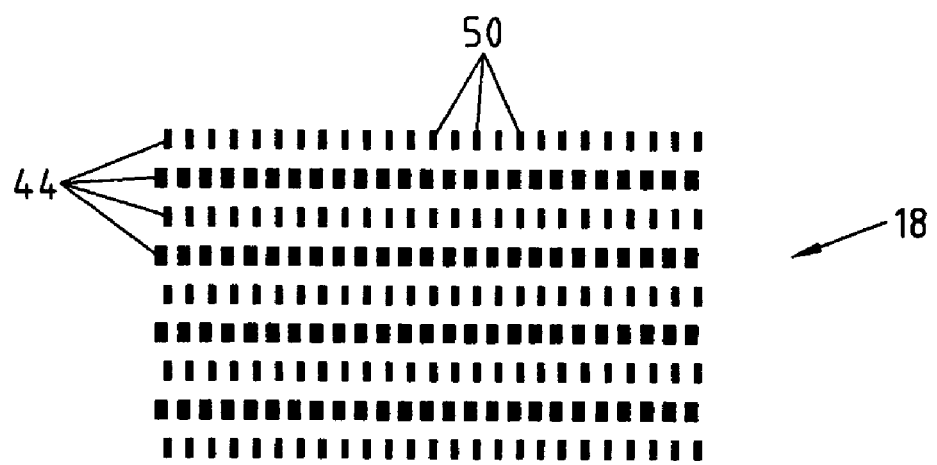
FIG. 3 shows a second exemplary embodiment of a beam-guiding mask.

As FIGS. 2 and 3 show, the beam-guiding mask 18 has a plurality of tracks 44. These are arranged in an orthogonal pattern and have substantially identical spacings from one another. In quite general terms, however, the tracks 44 can be present in a predefined arrangement in which the tracks themselves have a form which runs arbitrarily, that is to say is even curved, and have varying spacings from one another. This is because the arrangement of the tracks 44 reproduces the point pattern of the digital hologram to be written.

Furthermore, as has been explained extensively above, the tracks 44 of the beam-guiding mask 18 can have markings as carriers of track position information. Furthermore, the tracks 44 of the beam-guiding mask 18 can have markings as carriers of a start signal and possibly a stop signal.

The beam-guiding mask 18 can have a surface with different reflective properties. For this purpose, the beam-guiding mask 18 is to some extent provided with a reflective layer. Likewise, the different reflective properties can be formed as different colorations of the material of the beam-guiding mask. Likewise, different refractive properties of the material can effect the different reflective properties. Finally, the beam-guiding mask can be formed as a spatial light modulator (SLM). As a result, a time-variable beam-guiding mask is advantageously implemented.

Furthermore, the beam-guiding mask 18 can have a surface with a topographical surface structure, at which the scanning beam 22 is reflected diffractively.

For both configurations of the beam-guiding mask which reflects the scanning beam back in the direction of the light source 26, a beam output coupler 46 is provided in the beam path of the scanning beam 22, in front in the beam direction of the actuator 32 which tracks the beams 10 and 22. Said coupler leads the reflected scanning beam 22 to the detector 30'. There, the detection signal is generated as a control signal for the control means 36.

Furthermore, the beam-guiding mask 18 can have a surface with different transmission properties. The scanning beam 22 is therefore let through at different intensities. The proportion of the scanning beam 22 that is let through is focused by optics 48 onto the surface of the detector 30. There, the control signal for the control means 36 is then generated, and is transmitted via the line 42.

In this case, too, the material of the beam-guiding mask 18 can be formed in various ways. The different transmission properties can be produced by different colorations of the intrinsically translucent material. However, even in this case, the beam-guiding mask 18 can be formed as a spatial light modulator (SLM). As a result, a time-variable transmitting beam-guiding mask is advantageously implemented.

The control means 36 for generating a position control signal have computer means which are connected to the detectors 30' and/or 30". These compare the control signal picked up by the detectors with desired values, so that the control signal for the actuator 32 is produced as a function of the control signal.

The control means 36 are also used to generate a timed trigger signal. For this purpose, the start signals from corresponding markings at the ends of the tracks 44 are used in order then to generate a trigger signal at a predefined clock rate, with which the intensity of the light source 8 is controlled.

Furthermore, the tracks can themselves have trigger signals, as illustrated in FIG. 3. For this purpose, each track 44 is subdivided into a sequence of sections 50 with different optical properties, so that the trigger signal can be derived from the intensities of the scanning beam 22 measured by the detector 30' or 30".

The control means 36 can likewise be used for generating an intensity control signal. For this purpose, the control means 36 have storage means in which intensity values relating to the predefined positions along the tracks 44 are stored, are in each case read out and used to control the intensity of the light source 8.

However, the different intensities can also be contained in the individual sections 50 illustrated in FIG. 3, which may thus be derived from the signal detected by the detectors 30' and 30".

A further feature of the configurations described previously of the lithograph is that the distance between the storage medium 4 and the objective 16 can be adjusted variably in FIG. 1. This is identified by a double arrow designated "Z". For an adjustment of the distance in the z direction, means not illustrated in the Figures are provided. These can be any linear adjusting means which can be driven by motor or by hand. By means of adjusting the distance, the position of the focus in the storage medium 4 can be arranged at various depths, and likewise adjustment of the focus in the case of storage media 4 of different thicknesses is possible. Finally, at least two digital holograms can be written at different levels within the storage medium 4, in order to produce what are known as multilayer holograms.

Figure 4:
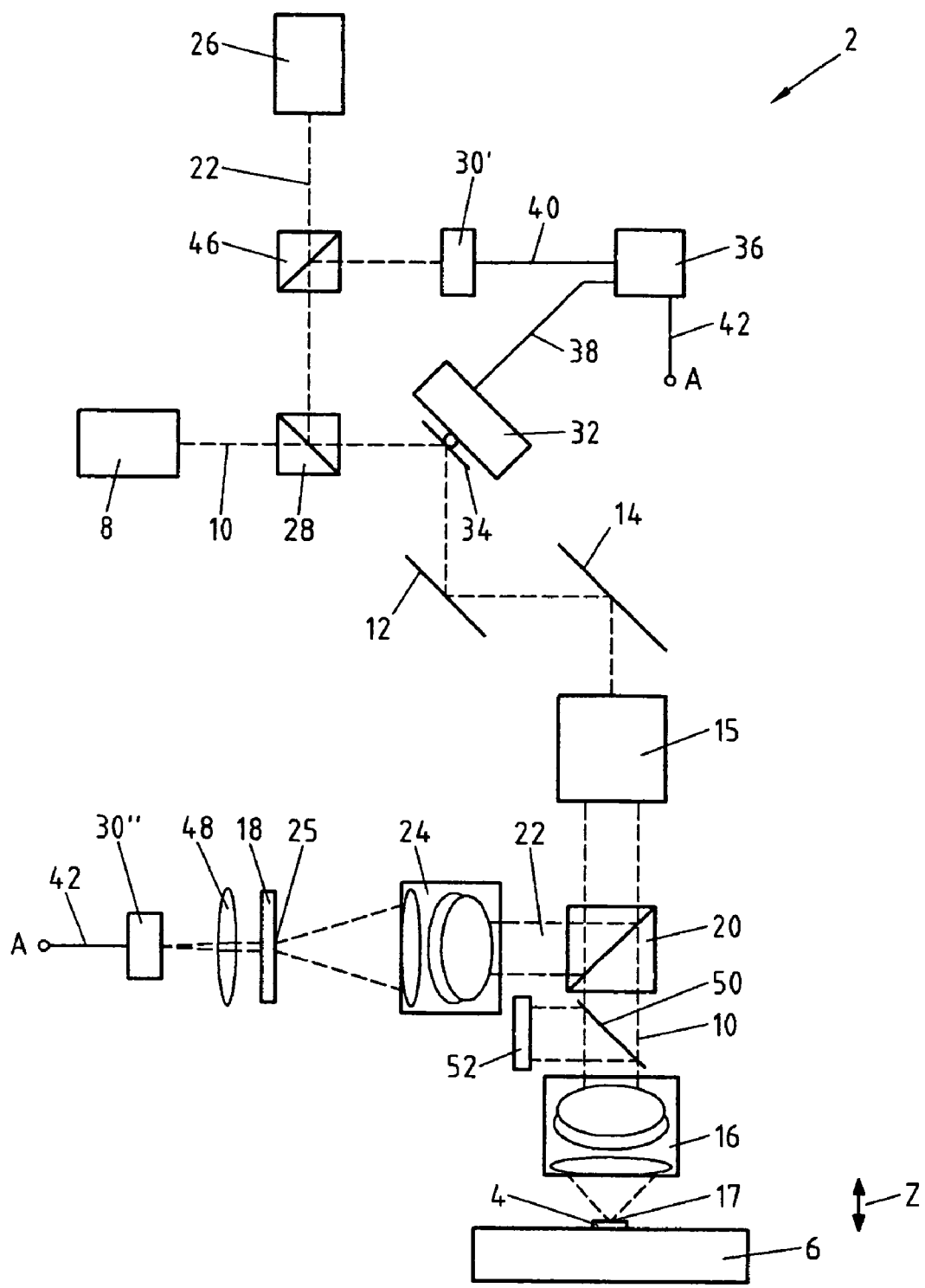
FIG. 4 shows a microscope according to the invention with a structure which corresponds substantially to the structure of the lithograph illustrated in FIG. 1.

FIG. 4 illustrates a microscope according to the invention which, in its structure, corresponds to the lithograph illustrated in FIG. 1. Therefore, identical designations designate identical components to those as have been described in connection with FIG. 1, even if, in detail, other designations are used which identify the difference between writing and observing.

In addition to the structure illustrated in FIG. 1, a deflection plane 50 is arranged in the beam path of the light reflected from the surface, behind, that is to say above, the objective 16. This can be implemented by means of a semitransparent mirror or a beam splitter and has no influence or only an insignificant influence on the observation beam.

The deflection plane 50 deflects the reflected beam laterally, to the left in FIG. 4, so that it strikes a photosensor 52 which measures the intensity of the reflected light.

By varying the observation beam 10 relative to the object 4 to be viewed under the microscope, the surface is then scanned and the reflectance measured point by point. An image of the scanned surface can thus be assembled.

If, then, the light beam emitted by the light source 8, which can be designated an observation beam in the microscope, is produced with a substantially identical intensity, then the measured intensity of the reflected beam is a measure of the reflectance of the scanned surface.

The invention claimed is:

1. A method of producing a digital hologram in a storage medium, the method comprising:
    focusing a write beam onto the storage medium;
    moving the write beam two-dimensionally relative to the storage medium;
    focusing a scanning beam onto a beam-guiding mask the beam-guiding mask having a plurality of tracks;
    moving the scanning beam two-dimensionally relative to the beam-guiding mask, the movement of the scanning beam being coupled with the movement of the write beam and the scanning beam being coupled out so it is not incident upon the storage medium;
    generating a position control signal when the position of the scanning beam deviates from the scanned track by a predefined value;
    controlling the position of the write beam on the storage medium with the aid of the position control signal; and
    writing the hologram by introducing radiation energy point by point, the intensity of the write beam being controlled as a function of the position of the write beam on the storage medium.

2. The method of claim 1, wherein the scanning beam is moved in a predefined movement relationship with the write beam.

3. The method of claim 1, wherein the scanning beam is focused onto a size which corresponds at most to the track dimension of the beam-guiding mask.

4. The method of claim 1, wherein the tracks of the beam-guiding mask have a different reflectance from the surrounding surface laterally beside the tracks, and in which the beam reflected from the surface of the beam-guiding mask is detected, the position control signal being derived from the intensity distribution of the reflected beam.

5. The method of claim 1, wherein the tracks of the beam-guiding mask have a different transmission property from the surrounding surface laterally beside the tracks, and in which the beam transmitted through the beam-guiding mask is detected, the position control signal being derived from the intensity distribution of the transmitted beam.

6. The method of claim 1, wherein the tracks of the beam-guiding mask have a surface structure and in which the beam reflected from the surface of the beam-guiding mask is detected, the position control signal being derived from the intensity distribution of the reflected beam.

7. The method of claim 1, wherein the scanning beam has three part beams running beside one another and in which, in addition to the central beam, the position control signal is derived from the intensities of the two marginal beams.

8. The method of claim 1, wherein during the scanning of the scanning beam along the track of the beam-guiding mask, a direction signal is generated.

9. The method of claim 8, wherein two periodic structures with different optical properties, offset by a predefined phase in each case, preferably by 90°, are formed along the tracks, and in which a direction signal is derived from the signal components produced in the detected beam by the periodic structures.

10. The method of claim 1, wherein at least at one of the ends of each track, a marking is provided from which a start signal or a stop signal is derived.

11. The method of claim 10, wherein the marking contains address information.

12. The method of claim 11, wherein the position of the track within the plurality of tracks is derived from the address information.

13. The method of claim 10, wherein the tracks have a periodic sequence of sections with different optical properties, from which a trigger signal for controlling the intensity of the write beam is derived.

14. The method of claim 13, wherein during the scanning along one of the tracks, beginning with the start signal, a periodic trigger signal is generated with which the intensity of the write beam is time-controlled.

15. The method of claim 14, wherein the trigger signal is linked with an intensity control signal, with which the intensity of the write beam is controlled in terms of its magnitude.

16. The method of claim 15, wherein the intensity control signal is derived from the intensity of the scanning beam.

17. The method of claim 16, wherein the intensity control signal is stored externally in a storage means and the associated intensity value is determined with the aid of the position of the track and the time within the scanning of the track.

18. The method of claim 1, wherein the distance between the objective and the storage medium is adjusted for writing at different depths within the storage medium.

19. A lithograph for producing digital holograms in a storage medium, the lithograph comprising:
    a light source for producing a write beam;
    a drive means for the two-dimensional movement of the write beam relative to the storage medium;
    a first objective for focusing the write beam onto the storage medium to be written;
    a two-dimensional beam-guiding mask, a means of producing a scanning beam, and a second objective for focusing the scanning beam onto the two dimensional beam-guiding mask, wherein the drive means is adapted to move the scanning beam two-dimensionally relative to the surface of the beam-guiding mask, and wherein the movement of the scanning beam is coupled with the movement of the write beam, and wherein the scanning beam is coupled out so it is not incident upon the storage medium;
    a detector adapted to pick up the scanning beam, wherein the intensity of the scanning beam can be varied by the optical properties of the track;
    a means of tracking the write beam and the scanning beam; and
    a means for producing a position control signal.

20. The lithograph of claim 19, farther comprising a means for generating a signal for controlling the intensity of the write beam with the beam-guiding mask.

21. The lithograph of claim 19, wherein the means of tracking the write beam and the scanning beam is formed as an x/y actuator.

22. The lithograph of claim 19, wherein:
    the drive means are formed as an x/y scanning mirror arrangement for moving the write beam; and
    the means of producing the scanning beam have means for coupling part of the write beam out as a scanning beam in the beam path of the write beam behind the drive means.

23. The lithograph of claim 22, wherein the means of producing the scanning beam comprises:

a second light source for producing a scanning beam with a wavelength or polarization differing from the write beam;

an input coupling means for coupling the scanning beam into the beam path of the write beam in front of the drive means; and an output coupling means for coupling out the scanning beam.

24. The lithograph of claim 19, farther comprising a predefined length-based step-up ratio between the movement of the scanning beam on the beam-guiding mask and the write beam on the storage medium.

25. The lithograph of claim 24, wherein the focal length of the second objective is greater by a predefined factor than the focal length of the first objective.

26. The lithograph of claim 19, wherein the beam-guiding mask farther comprises a plurality of tracks.

27. The lithograph of claim 26, wherein the tracks are arranged in an orthogonal pattern.

28. The lithograph of claim 26, wherein the beam-guiding mask further comprises a surface with different reflective properties.

29. The lithograph of claim 28, wherein the beam-guiding mask-is formed as a spatial beam modulator.

30. The lithograph of claim 28, further comprising a beam output coupler, which leads the reflected scanning beam to the detector, in the beam path of the scanning beam, in front in the beam direction of the means of tracking the beams.

31. The lithograph of claim 26, wherein the beam-guiding mask further comprises a surface with a topographical surface structure at which the scanning beam is reflected.

32. The lithograph of claim 26, wherein the beam-guiding mask further comprises a surface with different transmission properties.

33. The lithograph of claim 32, wherein the beam-guiding mask is formed as a spatial light modulator.

34. The lithograph of claim 32, further comprising focusing optics for focusing the transmitted radiation onto the detector.

35. The lithograph of claim 26, wherein the tracks of the beam-guiding mask further comprises markings as carriers of track position information.

36. The lithograph of claim 26, wherein the tracks of the beam-guiding mask further comprise markings as carriers of at least one of a start signal and a stop signal.

37. The lithograph of claim 19, wherein the control means for producing a position control signal further comprises at least one of a computer means and storage means, which are connected to the detectors.

38. The lithograph of claim 19, wherein the control means for producing an intensity control signal further comprises at least one of a computer means and storage means, which are connected to the detectors.

39. The lithograph of claim 19, further comprising means for adjusting the distance between the storage medium and at least one of the first objective and the second objective.

40. A microscope for scanning an object, the microscope comprising:

a light source for producing an observation beam;

a drive means for effecting a two-dimensional movement of the observation beam relative to the object;

a first objective for focusing the scanning beam onto the object;

a two-dimensional beam-guiding mask, a means of producing a scanning beam, a second objective for focusing the scanning beam onto the beam-guiding mask, and the drive means moving the scanning beam two-dimensionally relative to the surface of the beam-guiding mask, the movement of the scanning beam being coupled with the movement of the observation beam, and the scanning beam being coupled out so it is not incident upon the object;

a detector for picking up the scanning beam of which the intensity is varied by the optical properties of the track;

a means of tracking the write beam and the scanning beam; and a means for producing a position control signal.

* * * * *

UNITED STATES PATENT AND TRADEMARK OFFICE
CERTIFICATE OF CORRECTION

| | |
|---|---|
| PATENT NO. | : 7,445,873 B2 |
| APPLICATION NO. | : 10/473546 |
| DATED | : November 4, 2008 |
| INVENTOR(S) | : Noehte et al. |

It is certified that error appears in the above-identified patent and that said Letters Patent is hereby corrected as shown below:

In claim 20, at column 10, line 53, delete "farther" and replace it with --further--.

In claim 24, at column 11, line 9, delete "farther" and replace it with --further--.

In claim 26, at column 11, line 17, delete "farther" and replace it with --further--.

In claim 29, at column 11, line 24, delete "mask-is" and replace it with --mask is--.

In claim 37, at column 12, line 10, delete "detectors" and replace it with --detector--.

In claim 38, at column 12, line 14, delete "detectors" and replace it with --detector--.

Signed and Sealed this

Thirty-first Day of March, 2009

JOHN DOLL
*Acting Director of the United States Patent and Trademark Office*